Figure 1:
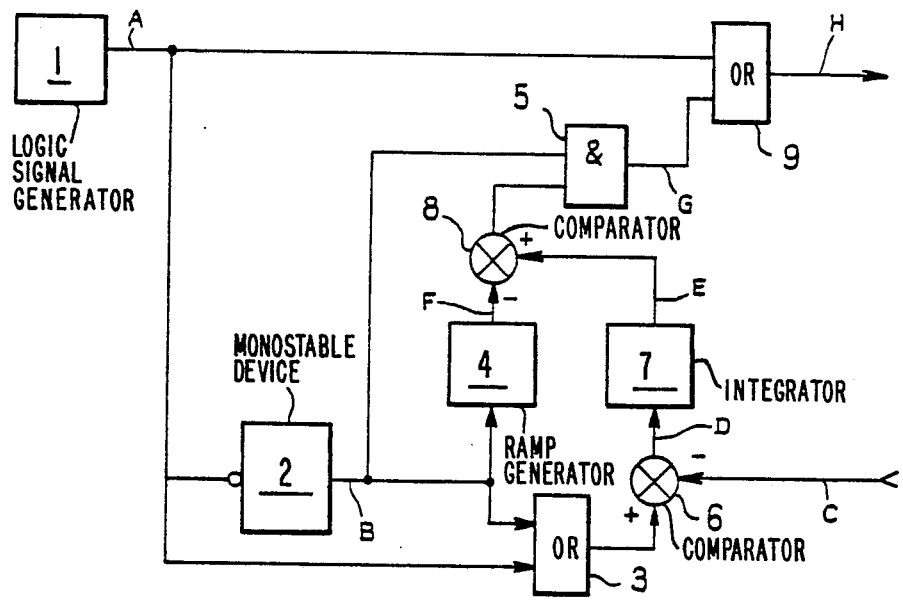

United States Patent [19]

Andrejack et al.

[11] Patent Number: 4,746,812
[45] Date of Patent: May 24, 1988

[54] PROCESS FOR CONTROL OF THE INSTANT OF OPENING OF AN INTERRUPTER, AND CORRESPONDING LOGIC CIRCUIT

[75] Inventors: Jean-Marie Andrejack, Avon; Henri Foch, Toulouse, both of France

[73] Assignee: Jeumont-Schneider Corporation, Puteaux cedex, France

[21] Appl. No.: 851,251

[22] Filed: Apr. 14, 1986

[30] Foreign Application Priority Data

Apr. 17, 1985 [FR] France .................. 85 05760

[51] Int. Cl.⁴ .................. H03K 17/56; H03K 3/33; H03K 5/13
[52] U.S. Cl. .................. 307/240; 307/253; 307/269; 307/300
[58] Field of Search .............. 307/254, 255, 300, 280, 307/253, 269, 270, 240; 323/289

[56] References Cited

U.S. PATENT DOCUMENTS

| | | | |
|---|---|---|---|
| 4,318,011 | 3/1982 | Zeis | 307/300 |
| 4,410,810 | 10/1983 | Christen | 307/280 |
| 4,574,204 | 3/1986 | Bonnet | 307/280 |

Primary Examiner—Stanley D. Miller
Assistant Examiner—B. P. Davis
Attorney, Agent, or Firm—Rines and Rines; Shapiro and Shapiro

[57] ABSTRACT

The invention concerns a process for control of the opening of a power interrupter, especially a transistor, at a determined instant, regardless of the particular characteristics of the interrupter. According to the invention, the emission of the normal closing command (A) of the interrupter is terminated at a determined time interval before the said determined instant, and in its place is emitted an additional closing command (G) with a duration equal to the difference between the said interval and the actual time required by the interrupter to pass from the closed state to the open state. Preferably, the actual time required by the interrupter to change state is determined during its preceding passages from the closed state to the open state.

9 Claims, 1 Drawing Sheet

PROCESS FOR CONTROL OF THE INSTANT OF OPENING OF AN INTERRUPTER, AND CORRESPONDING LOGIC CIRCUIT

The present invention concerns power interrupters, especially choppers, constituted by transistors arranged in series.

In order to prevent the voltage applied between the collector and emitter of each of the transistors from increasing to an unacceptable level for the given transistor, it is necessary for all of the transistors to shut off simultaneously. Moreover, by obtaining simultaneous cutoff of the transistors in series, a measurable savings in energy consumption results from a reduction of power losses.

In practice, the time of cutoff of each of the transistors is essentially a function of its own characteristics, and varies over a relatively wide range from one transistor to another. The present invention has as its goal to adjust the timing of the signal for cutoff of a transistor, so that the effective cutoff of the transistor will be achieved at the desired instant.

According to a first object of the invention, there is provided a process for control of the opening of an interrupter, especially a transistor, at a desired instant regardless of the characteristics of the given interrupter.

Summarizing the invention, the normal command for closing of the interrupter is terminated at a given time interval before this specified instant, and in its place is sent an additional closing command with a duration equal to the difference between this interval and the actual time required by the interrupter to pass from its closed state to its open state. Preferably, the actual time required by the interrupter to change its state is determined during its prior passages from the closed state to the open state. This actual time may be determined and placed in memory during each passage from the closed state to the open state.

According to another of its objects, the invention concerns a logic circuit to implement the foregoing process.

According to the invention, the logic circuit includes a first generator of a logic signal corresponding to the normal command for closing of the interrupter. This signal controls monostable device emitting a response impulse of determined duration at the stage corresponding to the cessation of the normal closing command. An OR gate has two inputs of which are applied respectively the signal issuing from the first generator and the signal issuing from the monostable device. The OR gate output signal is applied to one input of a first comparator, while to the comparator input of opposite sign is applied a logic signal representing the current state of the interrupter. The output of the first comparator is connected to the input of an integrator circuit whose output is connected to a first input of a second comparator circuit, whose second input, of opposite polarity, is connected to the output of a ramp generator controlled by the monostable device. The second comparator provides at its output a logic signal representative of the sign of the difference between the two signals applied at its inputs. The second comparator's output is with this output connected to one of the inputs of an AND gate. The other input of the AND gate is connected to the output of the monostable device. The AND gate output is connected to one input of an OR gate, to the other input of which is applied the signal issuing from the first generator. This OR gate's output signal constitutes the actual logic signal corresponding to the interrupter closing command.

Figure 2:
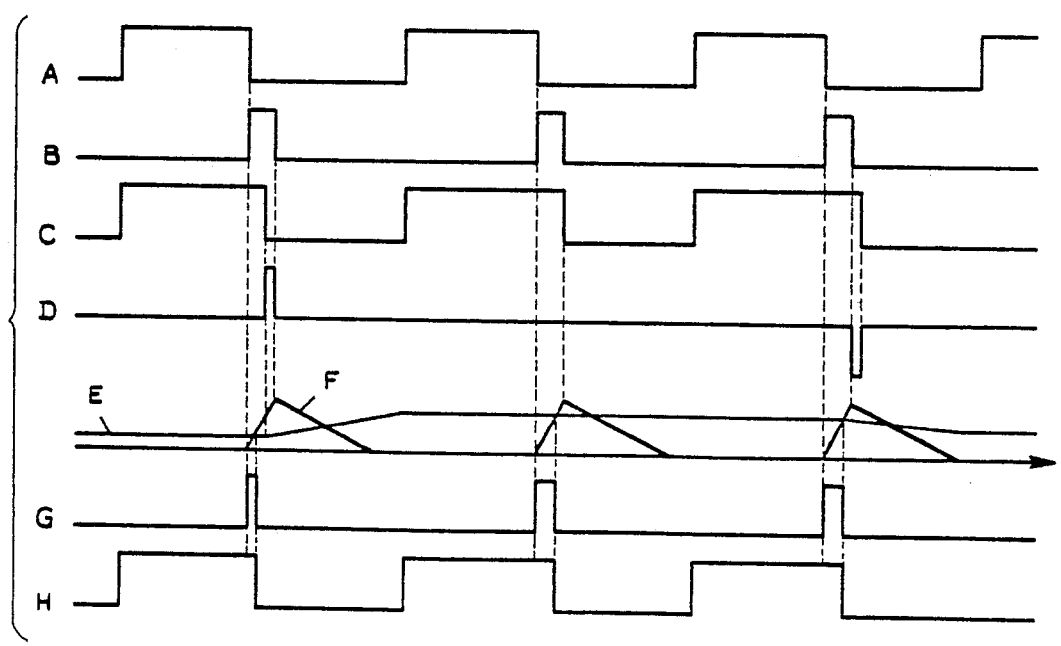

The invention will be better understood, and other goals, advantages and characteristics of the invention, will become more clear from the following description of a preferred mode of realization given in a non-limitational way, to which one sheet of figures is appended, wherein:

FIG. 1 represents schematically a logic circuit conforming to the present invention, and FIG. 2 represents schematically the form of the signals as a function of time, at various points of the circuit represented in FIG. 1.

Referring now to the figures, a signal generator 1 emits a logic signal A corresponding to the normal closing command of an interrupter. The interrupter is not represented here, but may be, for example, a transistor, a thyristor, or any type of relay whatever, static or not.

The trailing (descending) steps of this signal controls a monostable device 2 which produces in response to each trailing step a peak B of determined duration, for example 20 microseconds.

This peak is applied to respective inputs of an OR gate 3, finally to a ramp generator 4, and finally to an AND gate 5.

The OR gate 3 has its other input connected to the generator 1, and its output is connected to one input of a first comparator 6, to the other input of which, with opposite polarity, is applied a logic signal C representing the actual state of the interrupter.

This latter signal C is obtained, for example, by measuring at every instant the voltage between the contacts of the interrupter, and generating a signal with state 1 when this voltage is zero, that is, when the interrupter is closed, and a signal with state 0 when this voltage is non-zero, that is, when the interrupter is open.

The first comparator provides at its output a signal D, representing, in sign (polarity) and duration, the difference between the two signals applied at its inputs.

This signal D is integrated continuously by means of an integrator circuit 7, whose output signal is labeled E.

During this time, the output signal B of the monostable device 2 is applied to the ramp generator 4 which generates a reference signal F, in FIG. 2, presenting an established gate.

The two signals E and F are applied to a second comparator 8, which produces a logic signal (not represented in the figure) representing the sign of the difference between the two signals E and F, this signal having the state 1 when the amplitude of the signal E is greater than that of signal F, and otherwise being at the state 0.

Thus by connecting the output of this second comparator 8 to one input of an AND gate 5, to the other input of which is applied the signal B coming from the monostable device 2, the output of this AND gate provides an impulse G of variable width, corresponding to an additional closing command for the interrupter. This additional closing command signal has a duration equal to the difference between the width of the signal B issuing from the monostable device 2 and the actual time required for the interrupter to pass from the closed state to the open state. This actual time, in practice, is determined during each opening, placed into memory by the integrator 7, and utilized for the subsequent opening in the emission of the additional interrupter closing command.

Toward this end, an OR gate 9 receives at its respective inputs the normal signal A issuing from the generator 1, and the additional signal G issuing from the AND gate 5, in such a way that the output signal H of this OR gate 9 constitutes the actual logic signal corresponding to the interrupter closing command.

With such a logic circuit, after two or three successive commutations, the interrupter opens systematically at the descending step of the signal B, regardless of the particular characteristics of the interrupter.

In FIG. 2 are represented three cycles of change of state of the interrupter. In the course of the first cycle, at the left, it is seen that the amplitude of the signal E, in the hypothesis considered, is relatively weak. The resulting additional signal G thus presents a short duration. Because of this, the interrupter will open (descending step of the signal C) before the required instant (descending step of the signal B issuing from the monostable device 2). There thus results a positive impulse D which is applied to the integrator 7, whose output signal thus presents a greater amplitude. During the subsequent cycle, the additional signal G resulting from the comparison of the amplitudes of the signals E and F, presents a greater duration, which makes it possible, in the example considered, to achieve a precise coincidence between the moment established for the opening of the interrupter (descending step of the signal B) and the actual moment of this opening (descending step of the signal C). The third cycle, represented at the right in FIG. 2, illustrates the case in which the actual opening occurs after the instant established by the descending level step of the signal B. It is seen that the signal D then presents an opposite polarity, and the amplitude of the output signal E of the integrator circuit 7 consequently diminishes so that the duration of the subsequent additional signal G (not represented in the figure) will be less than that of the preceding additional signal.

Although only a single mode of embodiment of the invention has been described, it is obvious that various changes may be made that will not constitute a departure from the scope of the present invention as defined by the appended claims.

We claim:

1. A method for controlling switching of an interrupter from a closed state to an open state such that said interrupter reaches said open state at a predetermined instant, comprising terminating a first closing command signal to said interrupter at a predetermined time interval in advance of said predetermined instant and upon termination of said first closing command signal applying a second closing command signal to said interrupter, said second closing command signal having a duration equal to the difference between the duration of said predetermined interval and the actual time required for said interrupter to pass from said closed state to said open state.

2. A method according to claim 1, wherein said actual time is determined during preceding passages of said interrupter from said closed state to said open state.

3. A method according to claim 2, wherein said actual time is determined and placed in memory during each passage of said interrupter from said closed state to said open state.

4. A method according to claim 1, wherein the time difference between said predetermined instant and the passing of said interrupter from said closed state to said open state is determined during each said switching of said interrupter, and wherein the duration of the second closing command signal for the next switching of said interrupter is adjusted in accordance with said time difference.

5. A circuit for controlling switching of an interrupter from a closed state to an open state such that said interrupter reaches said open state at a predetermined instant, comprising means for applying a first closing command signal to said interrupter and for terminating said first closing command signal at a predetermined interval in advance of said predetermined instant, and means for applying a second closing command signal to said interrupter upon termination of said first closing command signal, said second closing command signal having a duration equal to the difference between the duration of said predetermined interval and the actual time required for said interrupter to pass from said closed state to said open state.

6. A circuit according to claim 5, wherein said means for applying said second closing command signal includes means for determining the time difference between said predetermined instant and the time when said interrupter actually reaches said open state and means connected to said time difference determining means for adjusting in accordance with said time difference the duration of the second closing command signal for the next switching of said interrupter.

7. A circuit according to claim 6, wherein said time difference determining means includes a comparator connected to provide an output signal of duration equal to said time difference.

8. A circuit according to claim 7, wherein the polarity of said output signal indicates whether the time when said interrupter actually reaches said open state occurs before or after said predetermined instant.

9. A logic circuit for controlling switching of an interrupter from a closed state to an open state such that said interrupter reaches said open state at a predetermined instant, comprising means for generating a first closing command signal to be applied to said interrupter and for terminating said first closing command signal at a predetermined interval in advance of said predetermined instant, nonstable means having an input connected to an output of said generating means and providing an output pulse equal in duration to said interval in response to the termination of said first closing command signal, an OR gate having inputs connected respectively to said output of said generating means and an output of said monostable means, a comparator having an input of first polarity connected to an output of said OR gate and an input of second polarity which is to have a logic signal representative of the state of said interrupter applied thereto, an integrater having an input connected to an output of said comparator, a ramp generator having a control input connected to said output of said monostable means, a second comparator having an input of first polarity connected to an output of said integrater and an input of second polarity connected to an output of said ramp generator, said second comparator providing an output signal having a polarity representing the sign of the difference between respective signals applied to said inputs thereof by said integrator and said ramp generator, an AND gate having an input connected to said output of said monostable means and another input connected to an output of said second comparator, and a second OR gate having an input connected to said output of said generating means and another input connected to an output of said AND gate, said second OR gate providing an output signal which constitutes the effective closing command signal to be applied to said interrupter.

* * * * *